United States Patent [19]

Matsushita

[11] Patent Number: 5,546,556
[45] Date of Patent: Aug. 13, 1996

[54] DISK STORAGE SYSTEM HAVE A DEFECT MAP OF THE DISK STORED IN A MEMORY WHICH IS DIFFERENT FROM THE DISK

[75] Inventor: Toyohiko Matsushita, Tokyo, Japan

[73] Assignee: Kabushiki Kaisha Toshiba, Kawasaki, Japan

[21] Appl. No.: 712,412

[22] Filed: Jun. 10, 1991

[30] Foreign Application Priority Data

Jun. 11, 1990 [JP] Japan ................................. 2-149760

[51] Int. Cl.$^6$ ............................. G06F 11/00; G06F 12/00
[52] U.S. Cl. ................. 395/427; 395/183.2; 395/185.01; 395/430; 395/489; 395/800
[58] Field of Search ........................ 369/54, 58; 395/800, 395/430, 183.2, 185.01, 489

[56] References Cited

U.S. PATENT DOCUMENTS

| | | | |
|---|---|---|---|
| 4,593,354 | 6/1986 | Ushiro | 395/185.01 |
| 4,953,122 | 8/1990 | Williams | 395/404 |
| 5,075,804 | 12/1991 | Deyring | 360/49 |
| 5,146,571 | 9/1992 | Logan | 395/182.06 |
| 5,200,959 | 4/1993 | Gross et al. | 371/21.6 |
| 5,239,635 | 8/1993 | Stewart et al. | 395/416 |

*Primary Examiner*—Tod R. Swann
*Assistant Examiner*—Denise Tran
*Attorney, Agent, or Firm*—Oblon, Spivak, McClelland, Maier & Neustadt, P.C.

[57] ABSTRACT

A disk storage system, provided with a disk as an information storage unit, having information of defects relating to the disk. The disk storage system includes a disk drive unit for driving the disk in its operable state, a memory unit different from the disk for storing information of defects relating to the disk, and a disk controller for detecting defects relating to the disk and for controlling the disk drive unit and the memory unit to store information of the defects relating to the disk into the memory means and to access the stored information of defects relating to the disk.

3 Claims, 2 Drawing Sheets

DISK STORAGE SYSTEM HAVE A DEFECT MAP OF THE DISK STORED IN A MEMORY WHICH IS DIFFERENT FROM THE DISK

BACKGROUND OF THE INVENTION

1. Field of the Invention

This invention relates a disk storage system, and more particularly to a disk storage system having information of defects relating to a disk.

2. Discussion of the Background

A typical construction for an information processing system provided with a disk system, for instance a magnetic disk system, is shown in FIG. 1. In FIG. 1, a magnetic disk system 30 is connected with a computer (host system) 40 through an input/output control system 50. Input/output control system 50 governs the data input/output of computer 40 and magnetic disk system 30 by controlling magnetic disk system 30 in response to requests from computer 40. A terminal 60 is connected to computer 40.

Magnetic disk system 30 includes disk drive (hard disk drive) 32 in which magnetic disk (hard disk) 31 as a memory medium is installed and disk controller (hard disk controller) 33 which controls disk drive 32. Disk drive 32 drives magnetic disk 31 in its operable state.

In the system in FIG. 1, when, for instance, a request for disk formatting is made to computer 40 from terminal 60, computer 40 causes the formatting of magnetic disk 31 to be executed by controlling disk controller 33 in magnetic disk system 30 via input/output-control system 50. When there are defects on magnetic disk 31, at disk formatting, disk controller 33 detects the defects on magnetic disk 31, as shown by symbol D in FIG. 2. Then, 'defect-related' information, which includes the disk addresses of these defects, is written to (recorded in) map table 71 maintained in a specified recording area (here, the final cylinder area of the same head) of the same magnetic disk 31, and formatting is continued. The recording area of magnetic disk 31 other than map table 71 is used as user area The defect-related information written to map table of magnetic disk 31 can be read into computer 40 by using the disk controller 33 via input/output control system 50, for instance, in response to a 'defect-related' information read request from terminal 60. This 'defect-related' information is used for the preservation of magnetic disk system 30.

The prior art is designed in the above way to record defect-related information in a map table which is reserved in a specified area of the disk. For this reason, there was the problem that, when a defect occurred in the map table, this disk system could not be used. There is also the problem that when the disk content is damaged there is a risk of the 'defect-related' information also being damaged at the same time. Furthermore, there is the problem that when the input/output control system provided between the computer and the disk system is not correct the map table could not be accessed.

SUMMARY OF THE INVENTION

It is an object of the invention to improve the storage system of information of defect relating to a disk used in a disk storage system.

Another object of the invention is to improve the accessibility to information of defect relating to a disk used in a disk storage system.

Additional objects and advantages will be obvious from the description which follows, or may be learned by the practice of the invention.

The foregoing objects are achieved according to the present invention by providing a disk storage system provided with a disk as information storage unit, having information of defects relating to the disk. The disk storage system includes disk drive means for driving the disk in its operable state, memory means different from the disk for storing the information of defects relating to the disk, and disk controller means for detecting defects relating to the disk and for controlling the disk drive means and the memory means to store information of the defects relating to the disk into the memory means and to access the stored information of the defects relating to the disk.

DETAILED DESCRIPTION OF THE PREFERRED EMBODIMENTS

Figure 1:
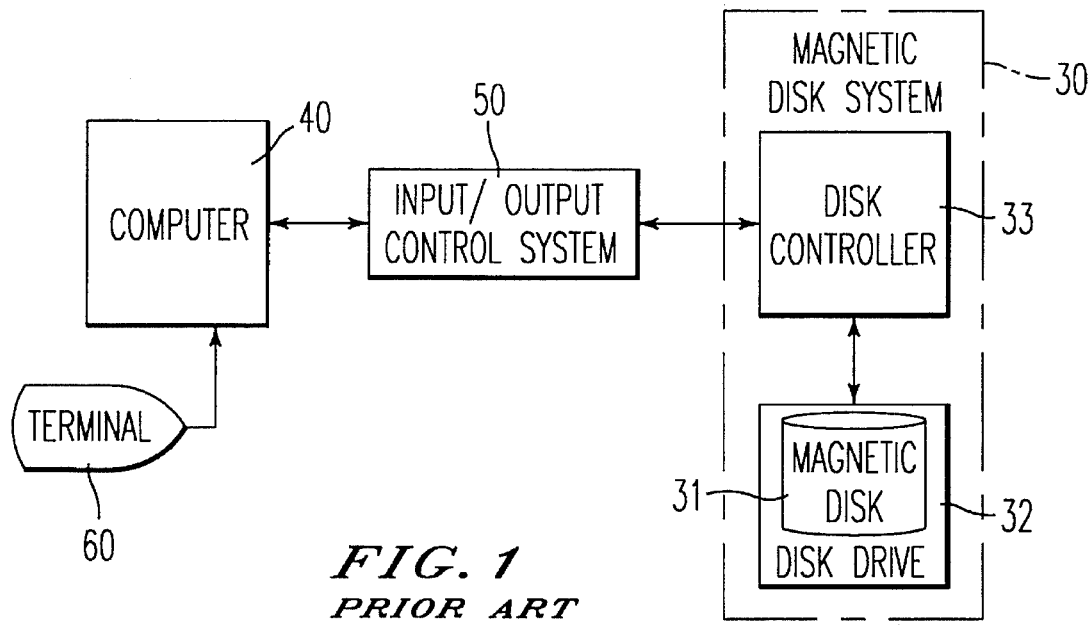
FIG. 1 is a block diagram showing a conventional information processing system providing with a conventional disk system.
Figure 2:
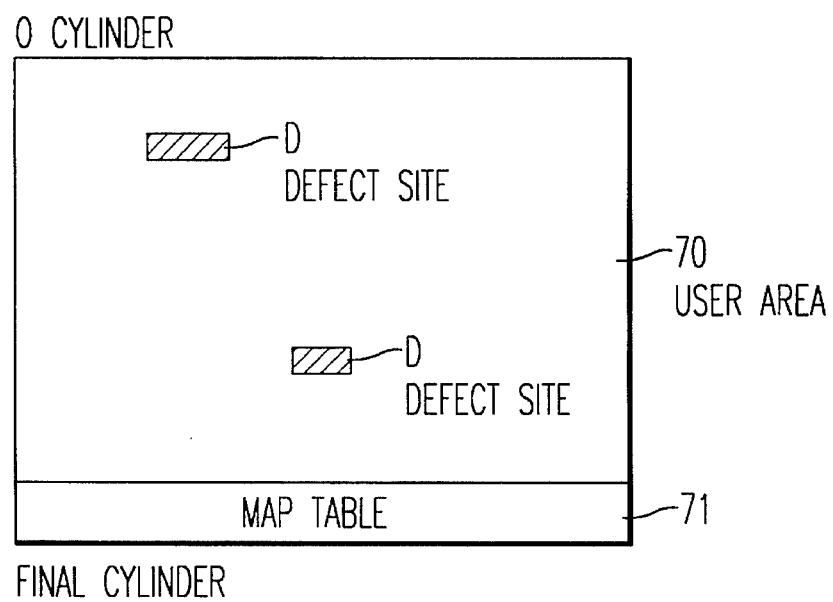
FIG. 2 is a diagram illustrating the areas of magnetic disk shown in FIG. 1.
Figure 3:
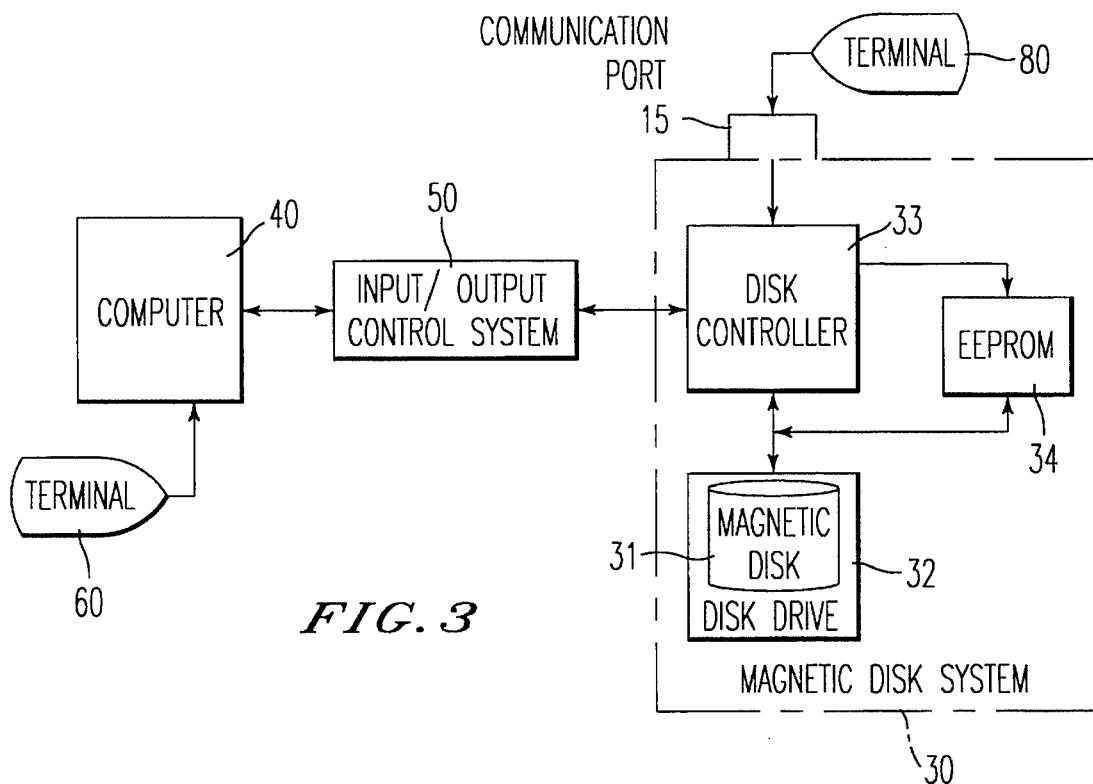
FIG. 3 is a block diagram showing an embodiment of an information processing system provided with a disk storage system according to the invention.

FIG. 3 is a block diagram showing an embodiment of an information processing system provided with a magnetic disk system according to this invention. Descriptions for those items with the same symbols as in FIG. 1 are omitted.

Figure 4:
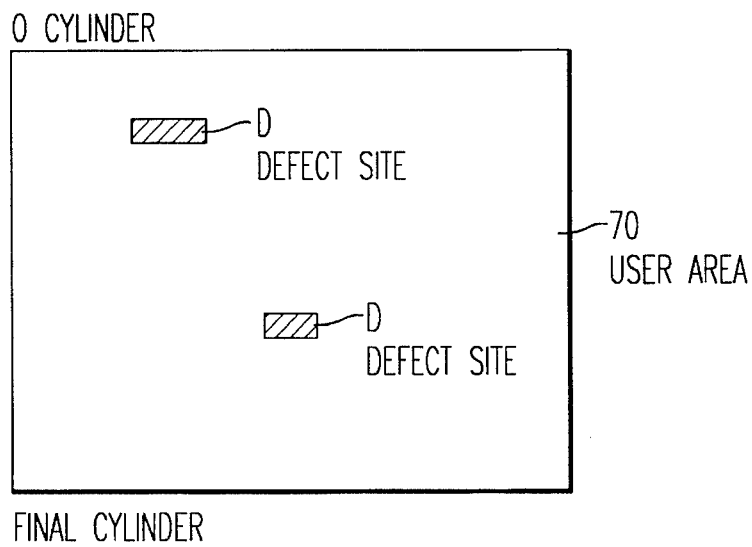
FIG. 4 is a diagram illustrating the areas of magnetic disk shown in FIG. 3.

In FIG. 3, a magnetic disk system 30 includes magnetic disk 31 which is the recording medium, disk drive 32 in which multiple magnetic disks 31 are pre-installed, disk controller 33 housing a microprocessor (not illustrated) which controls magnetic disks 31 and disk drive 32 and non-volatile re-writable memories, for instance electrically erasable programmable ROMs, that is to say EEPROMs 34. These EEPROMs 34 each have a capacity of, for instance, 1 track of a magnetic disk 31, and are apportioned for the number of magnetic disks 31×2, in other words for the number of heads. In this embodiment, EEPROMs 34 are used for recording 'defect-related' information concerning defects (D) on the surface of the corresponding magnetic disks 31 instead of the map tables which are reserved on the magnetic disks in prior art. That is to say, EEPROMs 34 are used as the map tables. Therefore, the whole of the recording area of any magnetic disk 31 can be used as user area 70, as shown in FIG. 4. Incidentally, 1 EEPROM with a large capacity can be used instead of using a separate EEPROM 34 for each head. The area of this EEPROM is divided into magnetic disk 31 1-track capacity units so that each divided area corresponds to a respective surface of a magnetic disk 31. It is also possible to use a volatile re-writable memory (RAM) instead of a non-volatile re-writable memory (EEPROM 34). However, in the case of using a volatile re-writable memory, its content will be lost in the event of a power cut, unless a battery back-up is used.

Standard communication port 15, such as an RS232C communication interface, is provided in magnetic disk system 30 for connecting terminal 80 (described later) to disk controller 33 of disk system 30. Standard terminal 80 is connected to communication port 15 for directly controlling disk controller 33 via port 15.

Next, the operation of the system in FIG. 3 is described below (a) in the case of detecting defect (D) when disk formatting and (b) in the case of access to EEPROMs 34 being requested from terminal 80.

(a)

First, when a disk formatting request is passed to computer 34 from terminal 60, computer 40 controls disk controller 33 of magnetic disk system 30 via input/output control system 50, and executes formatting for magnetic disks 31 installed in disk drive 32. The operation as far as this stage is the same as in the prior art. Disk controller 33 executes formatting for magnetic disks 31 under the control of computer 40. When a defect D is detected on a magnetic disk 31 (see FIG. 4), 'defect-related' information which includes the disk address indicating the site of the defect is written to EEPROMs 34 in the following manner. That is to say disk controller 33 writes the 'defect-related' information, not to a specified area on the surface of the magnetic disk 31 on which the defect site has been detected, but to that EEPROM 34 (for instance, to the position following the previous 'defect-related' information) corresponding to that surface (the head address which indicates that surface). Then, disk controller 33 continues with the rest of the formatting. The above writing of 'defect-related' information is not limited to defects detected during disk formatting. It is also executed in the same way when fresh defects occur during normal processing and are detected.

In this type of embodiment, disk controller 33 treats EEPROMs 34 as if they are map tables reserved in specified areas of magnetic disks 31. Incidentally, in this embodiment, the areas of EEPROMs 34 are designed to be viewed from computer 40 as corresponding to cylinders (which do not actually exist) immediately after the final cylinders on the surfaces of magnetic disks 31. Therefore, if input/output control system 50 is normal, it is possible for computer 40 to access EEPROMs 34 by controlling disk controller 33 by a request from terminal 60.

(b)

In the case of input/output control system 50 breaking down, sometimes the reading/writing of 'defect-related' information is needed for preservation. In such a case, in this embodiment, terminal 80 transmits to disk controller 33 in magnetic disk system 30 via communication port 15 a request for access to EEPROMs 34. When disk controller 33 receives the access request from terminal 80 through communication port 15, when it is a read access request, it executes the reading of 'defect-related' information from the requested EEPROM 34 and transmits that information to terminal 80 via communication port 15. On the other hand, if it is a write access request, disk controller 33 executes the process of writing to the EEPROM 34, in the same way as during formatting, write data, for instance additional 'defect-related' information produced from disk error address information held by OS (operation system), which is transmitted together with the write access request from terminal 80. Also, by executing write access to an EEPROM 34 based on the result of reading from that EEPROM 34, it is possible to erase desired 'defect-related' information at a desired disk address from an EEPROM 34.

The case of applying this invention to a magnetic disk system is described above. However, this invention can be applied in the same way to other disk systems such as optical disk systems.

When this invention is used as described above, the design is that map tables for recording 'defect-related' information are provided outside the disks in re-writable memories. Thus, even if defects occur in the disk areas which are allotted to map tables in the prior art, the disk system can be used continuously. Moreover, even if the disk content is damaged, the 'defect-related' information will not be damaged. Also, when using this invention, since the construction is such that a standard terminal can be connected via a communication port to the disk controller of the disk system, the disk controller can be directly controlled by this terminal. Therefore, even if the input/output control system breaks down, reading/writing of 'defect-related' information can be executed from the terminal (with the re-writable memory as the subject).

What is claimed is:

1. A disk storage system, for use with a disk, comprising:

disk drive means for driving the disk;

means for detecting defect-related information of the disk;

memory means, different from the disk and off of the disk, for storing defect-related information of the disk;

disk controller means for controlling the disk drive means, for writing the detected defect-related information of the disk into the memory means, and for reading the stored defect-related information from the memory means;

control means for instructing the disk controller means to virtually access the defect-related information in the memory means which is an off-disk storage area as if said defect-related information was stored on the disk.

2. A disk storage system according to claim 1, wherein said memory means comprises an EEPROM.

3. A disk storage method, comprising the steps of:

driving a disk using a disk drive means;

detecting defect-related information of the disk using a detecting means; and storing the defect-related information of the disk in a memory means which is different from the disk and is an off-disk storage area;

virtually accessing the defect-related information in the memory means which is an off-disk storage area as if the defect-related information was stored on the disk.

\* \* \* \* \*